United States Patent
Wang et al.

(10) Patent No.: US 12,372,584 B2
(45) Date of Patent: Jul. 29, 2025

(54) METHOD FOR DETERMINING CHARGING TIME, BMS, BATTERY, AND ELECTRICAL ENERGY DEVICE

(71) Applicant: CONTEMPORARY AMPEREX TECHNOLOGY (HONG KONG) LIMITED, Hong Kong (CN)

(72) Inventors: Haijiang Wang, Ningde (CN); Shuting Sun, Ningde (CN); Shichang Zhang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 323 days.

(21) Appl. No.: 17/950,096

(22) Filed: Sep. 22, 2022

(65) Prior Publication Data
US 2023/0228822 A1    Jul. 20, 2023

Related U.S. Application Data

(63) Continuation of application No. PCT/CN2022/089766, filed on Apr. 28, 2022.

(30) Foreign Application Priority Data

Jan. 19, 2022   (CN) .......................... 202210060952.7

(51) Int. Cl.
*G01R 31/388* (2019.01)
*G01R 31/36* (2020.01)
*H01M 10/42* (2006.01)

(52) U.S. Cl.
CPC ....... *G01R 31/388* (2019.01); *G01R 31/3646* (2019.01); *G01R 31/3648* (2013.01); *H01M 10/425* (2013.01); *H01M 2010/4271* (2013.01)

(58) Field of Classification Search
CPC .............. G01R 31/388; G01R 31/3646; G01R 31/3648; H01M 10/425;
(Continued)

(56) References Cited

U.S. PATENT DOCUMENTS

2015/0229151 A1* 8/2015 Sudan ............... H02J 7/007194
                                                                320/137
2015/0236523 A1   8/2015 Takano et al.
(Continued)

FOREIGN PATENT DOCUMENTS

CN        103779624 A      5/2014
CN        107394842 A      11/2017
(Continued)

OTHER PUBLICATIONS

The World Intellectual Property Organization (WIPO) International Search Report and written opinion for PCT/CN2022/089766 Oct. 20, 2022 14 pages (including English translation).
(Continued)

*Primary Examiner* — Alexander Satanovsky
(74) *Attorney, Agent, or Firm* — ANOVA LAW GROUP, PLLC

(57) ABSTRACT

A method for determining a charging time includes obtaining a maximum monomer voltage of a cell of a battery, and under a condition that the maximum monomer voltage is determined to be greater than or equal to a value, determining, based on a charging voltage of the battery, the charging time of the battery.

9 Claims, 3 Drawing Sheets

(58) Field of Classification Search
CPC ......... H01M 2010/4271; H01M 10/44; H01M 10/48; H02J 2310/48; H02J 7/0048; H02J 7/007182; Y02E 60/10; Y02T 10/70; Y02T 10/7072; B60L 58/13; B60Y 2200/91

See application file for complete search history.

(56) References Cited

U.S. PATENT DOCUMENTS

| | | | |
|---|---|---|---|
| 2016/0359350 | A1 | 12/2016 | Uesugi |
| 2018/0205261 | A1 | 7/2018 | Zhang et al. |
| 2021/0170900 | A1* | 6/2021 | Ando ............... H02J 7/0071 |

FOREIGN PATENT DOCUMENTS

| | | | | |
|---|---|---|---|---|
| CN | 108599295 | A | | 9/2018 |
| CN | 108646190 | A | | 10/2018 |
| CN | 111525654 | A | | 8/2020 |
| CN | 111555389 | A | | 8/2020 |
| CN | 111999660 | A | | 11/2020 |
| CN | 112035777 | A | | 12/2020 |
| CN | 112526346 | A | | 3/2021 |
| CN | 112526368 | A | | 3/2021 |
| CN | 113119759 | A | | 7/2021 |
| CN | 113484779 | A | | 10/2021 |
| CN | 113553534 | A | | 10/2021 |
| CN | 116298944 | A | | 6/2023 |
| EP | 4086110 | A1 | | 11/2022 |
| JP | H07105980 | A | | 4/1995 |
| JP | H08205418 | A | | 8/1996 |
| JP | 2002305038 | A | | 10/2002 |
| JP | 2011214930 | A | * | 10/2011 ............ G01C 21/26 |
| JP | 2012029394 | A | * | 2/2012 ............ Y02E 60/10 |
| JP | 2012115004 | A | | 6/2012 |
| JP | 2012228142 | A | | 11/2012 |
| JP | 2014523731 | A | | 9/2014 |
| JP | 2014236582 | A | | 12/2014 |
| JP | 2015233366 | A | | 12/2015 |
| JP | 2016195501 | A | | 11/2016 |
| JP | 2018014817 | A | | 1/2018 |
| KR | 20120069399 | A | | 6/2012 |
| WO | 2019230131 | A1 | | 12/2019 |
| WO | 2020166246 | A1 | | 8/2020 |
| WO | 2021238547 | A1 | | 12/2021 |

OTHER PUBLICATIONS

The China National Intellectual Property Administration (CNIPA) Notice of the first review opinion for CN Application No. 202210060952.7 Jun. 15, 2023 9 Pages (including English translation).

The China National Intellectual Property Administration (CNIPA) Notice of the Second Examination Opinion for CN Application No. 202210060952.7, Aug. 31, 2023 21 Pages (including English translation).

Jiuchun Jiang, et al., Electric vehicle charging technology and system, 2017, pp. 1-8, Beijing Jiaotong University Press Limited Liability Company.

Sheng Tian, Electric vehicle power battery life and energy management system research, 2018, pp. 1-6, South China University of Technology Press.

The China National Intellectual Property Administration (CNIPA) The Search report for CN Application No. 202210060952.7 8 Pages (including English translation).

The China National Intellectual Property Administration (CNIPA) The Search report for CN Application No. 202210060952.7 6 Pages (including English translation).

State Intellectual Property Office of China Notice of Grant of Invention Patent Right for Application No. 202210060952.7 Dec. 1, 2023 6 pages (including translation).

The Japan Patent Office (JPO) Notification of Reasons for Refusal for Application No. 2022-547161 Mar. 12, 2024 10 Pages (including translation).

The European Patent Office (EPO) The Extended European Search Report for Application No. 22744365.2 Oct. 14, 2024 11 Pages.

Korean Intellectual Property Office (KIPO) Office Action 1 for Application No. 10-2022-7027886 Oct. 21, 2024 10 Pages (including translation).

* cited by examiner

METHOD FOR DETERMINING CHARGING TIME, BMS, BATTERY, AND ELECTRICAL ENERGY DEVICE

CROSS-REFERENCE TO RELATED APPLICATIONS

This application is a continuation of International Application No. PCT/CN2022/089766, filed on Apr. 28, 2022, which claims priority to Chinese patent application No. 202210060952.7, filed on Jan. 19, 2022 and entitled "METHOD FOR DETERMINING CHARGING TIME, BMS, BATTERY, AND ELECTRICAL ENERGY DEVICE", the entire contents of both of which are incorporated herein by reference.

TECHNICAL FIELD

This application relates to the field of battery charging, and in particular, to a method for determining a charging time, a battery management system (BMS), a battery, and an electrical energy device.

BACKGROUND

As new energy electric vehicles get popular rapidly, charging time has become one of the main elements that numerous electric vehicle owners care about in their daily driving. Using software algorithms to accurately predict a remaining charging time of a present charging process can provide accurate time basis for electric vehicle owners to properly arrange their time of vehicle use and time of work and life. However, at present, charging time of a battery mainly depends on a remaining capacity to top up and output current of a charging pile, being a quotient of the former divided by the latter. This calculation method is ideal, which leads to inaccurate determination of the charging time because the charging state of the battery is changing at any time during charging, causing a lot of inconvenience to users, especially vehicle owners.

SUMMARY

In view of the foregoing problem, this application provides a method for determining a charging time, a BMS, a battery and an electrical power device to accurately determine a charging time of a battery under slow charging.

According to a first aspect, this application provides a method for determining a charging time, including: under a condition that a state of charge SOC of a battery reaches a SOC corresponding to slow charging, obtaining a maximum monomer voltage of a cell of the battery, and under a condition that the maximum monomer voltage is determined to be greater than or equal to a first value, determining, based on a charging voltage of the battery, the charging time of the battery.

Embodiments of this application mainly aim at determining a charging time when a battery SOC corresponding to slow charging is reached. For the condition that the maximum monomer voltage of the cell of the battery is greater than or equal to a first value, the first value may be set according to specific application scenarios. Through the change of charging time determination as in the embodiments of this application, when the SOC corresponding to slow charging is reached, the charging time determined in the embodiments of this application is more accurate with less error.

In some embodiments, the determining, based on a charging voltage of the battery, a charging time of the battery includes: calculating, based on a remaining capacity to top up and a charging current of the battery, a first remaining charging duration and saving the first remaining charging duration; calculating, based on the charging voltage and the first remaining charging duration of the battery, a second remaining charging duration in real time; and determining, based on a present time and the second remaining charging duration, the charging time of the battery.

The embodiments of this application propose a method for calculating a charging time of a battery when a battery SOC corresponding to slow charging is reached. To be specific, a remaining charging time is determined based on a charging voltage of the battery, and a charging time of the battery is determined based on a present time. The charging time determined in this way is more accurate, allowing an owner of an electric vehicle to arrange his/her own time properly based on the charging time of the battery and to determine a time when the battery is fully charged, allowing a user to conveniently use the vehicle.

In some embodiments, the method further includes: calculating a first difference between a charging voltage of the cell fully charged under slow charging and the maximum monomer voltage; and determining a ratio of the first difference to the first value as a voltage-follow ratio of a remaining charging time of the battery.

In the embodiments of this application, by determining the first difference between the charging voltage of the cell fully charged under slow charging and the maximum monomer voltage, the voltage-follow ratio of the remaining charging time of the battery can be determined, which facilitates accurate determination of the charging time when the battery SOC corresponding to slow charging is reached.

In some embodiments, the calculating, based on a charging voltage of the battery and the first remaining charging duration, a second remaining charging duration of the battery in real time includes: calculating a product of the first remaining charging duration multiplying the voltage-follow ratio and determining the product as the second remaining charging duration.

In the embodiments of this application, when the maximum monomer voltage of a cell of the battery continues to rise, a logic for calculating the charging time of the battery needs to be adjusted. Specifically, when the logic for calculating the remaining charging time changes to a voltage-follow calculation logic, the remaining charging time of the battery needs to be determined again based on the voltage-follow ratio, so as to determine a remaining charging time to fully charge the battery to provide a more accurate battery charging time.

In some embodiments, the calculating, based on a remaining capacity to top up and a charging current of the battery, a first remaining charging duration includes: calculating, based on a present SOC of the battery and a total capacity of the battery, a remaining capacity to top up of the battery; and calculating, based on the remaining capacity to top up of the battery and a present charging current, the first remaining charging duration.

In the embodiments of this application, to determine the charging time of the battery, it is also necessary to calculate, based on the remaining capacity to top up and the charging current of the battery, another remaining charging time, which is considered in combination with the foregoing charging time determined based on the maximum monomer voltage of the cell of the battery to determine the charging time of the battery. A charging time of the battery thus determined is more accurate, helping a user know an accurate charging time, and allowing the user to conveniently use the vehicle and plan his/her own actions.

In some embodiments, the first value is a second difference between a charging voltage of the cell fully charged under slow charging and a given voltage threshold, where the given voltage threshold is set under a condition that the charging time of the battery is determined based on a charging voltage of the battery.

In the embodiments of this application, the first value in the determining whether a maximum monomer voltage of a cell of a battery is greater than or equal to a first value can be determined as a difference between the charging voltage of the cell fully charged under slow charging and the given voltage threshold. The given voltage threshold may be determined via simulation based on charging features of the battery. Setting a voltage threshold helps determine a more accurate remaining charging time of the battery.

In some embodiments, the method further includes: in response to arrival of a transmission cycle or a request message, outputting the determined charging time of the battery to a target object.

In some embodiments, the method further includes: displaying a charging time of the battery via a display unit or transmitting the charging time of the battery to a managed client application via a network connection.

In the embodiments of this application, the determined remaining charging time of the battery needs to be outputted to a user for the user to make arrangements based on the remaining charging time of the battery. Specifically, the remaining charging time may be outputted via a display unit or transmitted via remote communication to a portable electronic device of the user, for example, a mobile phone. In this way, the user can obtain the remaining charging time of the battery without direct viewing, which is more convenient for the user to know the battery charging time.

According to a second aspect, this application provides a battery management system, including a processor and a storage medium, where the storage medium stores a computer program, and when executed by the processor, the computer program is able to calculate a charging time by using the method for determining a charging time.

According to a third aspect, this application provides a battery, including a battery cell and the foregoing battery management system.

According to a fourth aspect, this application provides an electrical energy device, including a device body and a power supply, where the power supply is the foregoing battery.

The above description is merely a summary of the technical solutions in the embodiments of this application In order to make clearer the technical means in the embodiments of this application for implementation according to content disclosed in the specification, and to make the above and other objectives, features and advantages of the embodiments of this application more obvious and easier to understand, the following describes specific embodiments of this application.

BRIEF DESCRIPTION OF DRAWINGS

Various other advantages and benefits will become clear to those of ordinary skill in the art upon reading the following detailed descriptions of some implementations. The drawings are merely intended to illustrate the objectives of some implementations and are not intended to limit this application. In all drawings, same components are indicated by same reference signs. In the accompanying drawings.

DESCRIPTION OF EMBODIMENTS

Figure 1:
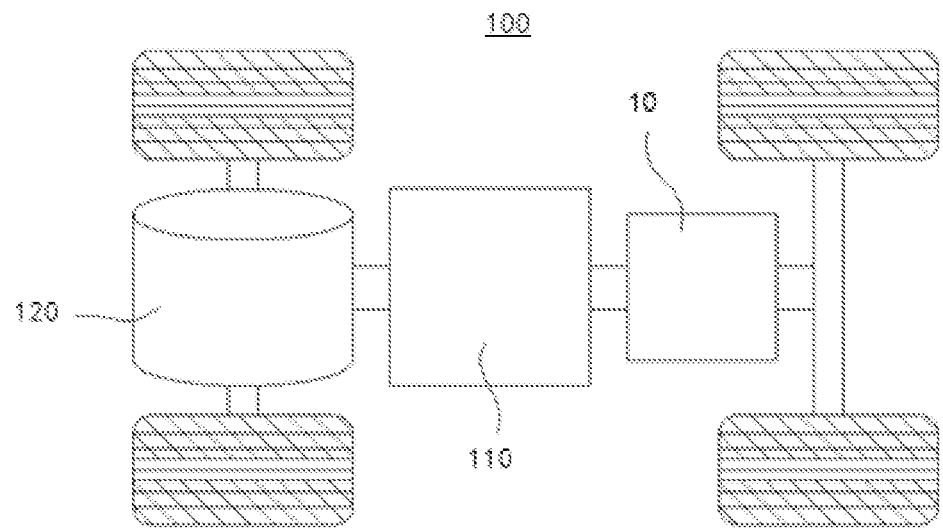
FIG. 1 is a schematic structural diagram of a vehicle according to some embodiments of this application.

The following describes the embodiments of technical solutions in this application in detail with reference to the accompanying drawings. The following embodiments are merely used to describe technical solutions in this application more explicitly, and therefore they are merely used as examples and do not constitute a limitation on the protection scope of this application.

Unless otherwise defined, all technical and scientific terms used herein shall have the same meanings as commonly understood by those skilled in the art to which this application belongs. The terms used herein are merely intended to describe the specific embodiments but not intended to constitute any limitation on this application. The terms "include", "comprise", "have" and any other variations thereof in the specification, the claims and the foregoing brief description of drawings of this application are intended to cover a non-exclusive inclusion.

In descriptions of the embodiments of this application, the terms "first" and "second" and the like are merely intended to distinguish between different objects, and shall not be understood as any indication or implication of relative importance or implicit indication of the quantities, specific sequence or dominant-subordinate relationship of indicated technical features. In the descriptions of the embodiments of this application, "a plurality of" means at least two unless otherwise specifically stated.

The term "embodiment" described herein means that specific features, structures or characteristics described with reference to the embodiment may be incorporated in at least one embodiment of this application. The word "embodiment" appearing in various places in the specification does not necessarily refer to a same embodiment, or an independent or alternative embodiment that is exclusive of other embodiments. Persons skilled in the art explicitly and implicitly understand that the embodiments described herein may combine with other embodiments.

In the descriptions of the embodiments of this application, the term "and/or" describes only an association relationship for describing associated objects and represents that three relationships may exist. For example, A and/or B may represent the following three cases: A alone, both A and B, and B alone. In addition, the character "/" in this specification generally indicates an "or" relationship between contextually associated objects.

In the descriptions of the embodiments of this application, the term "a plurality of" means two or more than two. Similarly, "a plurality of groups" means two or more than two groups, and "a plurality of pieces" means two or more than two pieces.

In the descriptions of the embodiments of this application, the orientations or positional relationships indicated by the technical terms "center", "longitudinal", "transverse", "length", "width", "thickness", "upper", "lower", "front", "rear", "left", "right", "perpendicular", "horizontal", "top", "bottom", "inside", "outside", "clockwise", "counterclockwise", "axial", "radial", "circumferential", and the like are based on the orientations or positional relationships shown in the accompanying drawings. They are merely intended for ease of description of the embodiments of this application and simplification of the description, rather than to indicate or imply that the apparatuses or components mentioned must have the specified orientations or must be constructed and operated in the specified orientations, and therefore shall not be construed as limitations on the embodiments of this application.

In the descriptions of the embodiments of this application, unless otherwise specified and defined explicitly, the technical terms "mount", "connect", "join", and "fix" should be understood in their general senses. For example, they may refer to a fixed connection, a detachable connection, or an integral union; or refer to a mechanical connection or an electrical connection; or refer to a direct connection or an indirect connection through an intermediate medium; or refer to internal communication between two components or interaction between two components. Persons of ordinary skill in the art can understand specific meanings of these terms in the embodiments of this application as appropriate to specific situations.

Currently, from the perspective of market development, application of traction batteries is becoming more and more extensive. Traction batteries are widely used not only in energy storage power supply systems such as hydro, thermal, wind, and solar power plants, but also in electric transport tools such as electric bicycles, electric motorcycles, electric vehicles, as well as many other fields such as military equipment and aerospace. With continuous expansion of the application fields of traction batteries, market demands for traction batteries are also increasing.

The inventors have noticed that in the process of determining a remaining charging time of a battery, the remaining charging time of a battery is mainly determined based on a remaining capacity to top up of the battery and an output current of a charging pile. However, a charging current of a battery varies with a state of charge of the battery. Especially under a condition that a state of charge SOC of a battery reaches a SOC corresponding to slow charging, such as 97%, a charging time determined by using a conventional method for determining a charging time will be highly inaccurate, leading to output of an inaccurate battery charging time, unfavorable for a user, especially an electric vehicle owner, to make an action plan.

In order to accurately determine a battery charging time, the inventors have found through research that when charging a battery, under slow charging, an output power is constant and a current is relatively stable; and at the late stage of slow charging, a maximum monomer voltage of a cell of the battery increases monotonically and progressively. When the maximum monomer voltage of the cell of the battery is greater than or equal to a difference between a charging voltage of a cell fully charged under slow charging (Volt_FullChrgVolt) and a voltage-follow voltage threshold (Volt_acfollowvoltThr), a logic for calculating a remaining charging time needs to be changed to calculating a remaining charging time based on a charging voltage of the battery.

A battery using the method for determining a charging time in the embodiments of this application may be applied in electric devices such as vehicles, ships, and aircrafts, helping users to schedule their subsequent actions based on the charging time of the battery.

An embodiment of this application provides an electric apparatus with a battery using a method for determining a charging time as a power supply. The electric apparatus may be but is not limited to a mobile phone, a tablet computer, a laptop computer, an electric toy, an electric tool, an electric scooter, an electric vehicle, a ship, a spacecraft, and the like. Electric toys may include stationary or movable electric toys, such as game consoles, electric vehicle toys, electric ship toys, electric airplane toys, and the like. Spacecrafts may include airplanes, rockets, space shuttles, spaceships, and the like.

Referring to FIG. 1, FIG. 1 is a schematic structural diagram of a vehicle 100 according to some embodiments of this application. The vehicle 100 may be an oil-fueled vehicle, a gas-powered vehicle, or a new energy vehicle. The new energy vehicle may be a battery electric vehicle, a hybrid electric vehicle, an extended-range electric vehicle, or the like. The vehicle 100 is provided with a battery 10 inside, and the battery 10 may be disposed at the bottom or in the front or at the rear of the vehicle 100. The battery 10 may be configured to supply power to the vehicle 100. For example, the battery 10 may be used as an operational power supply for the vehicle 100. The vehicle 100 may further include a controller 110 and a motor 120, and the controller 110 is configured to control the battery 10 to supply power to the motor 120, for example, to satisfy the need of working electricity during start, navigation, and driving of the vehicle 100.

In some embodiments of this application, the battery 10 can be used as not only the operational power supply for the vehicle 100 but also a driving power supply for the vehicle 100, replacing all or part of fossil fuel or natural gas to provide driving power for the vehicle 100.

In order to meet different power needs, the battery 10 may include a plurality of battery cells 210. A battery cell 210 is a smallest element constituting a battery module or a battery pack. The plurality of battery cells 210 may be connected in series and/or in parallel via electrode terminals for various application scenarios. The battery mentioned in this application includes a battery module or a battery pack. The plurality of battery cells 210 may be connected in series, parallel, or series and parallel, and being connected in series and parallel means a combination of series and parallel connections. The battery 10 may also be called a battery pack. The plurality of battery cells 210 in the embodiments of this application may directly constitute a battery pack, or may first constitute battery modules 20, and then the battery modules 20 constitute a battery pack.

Figure 2:
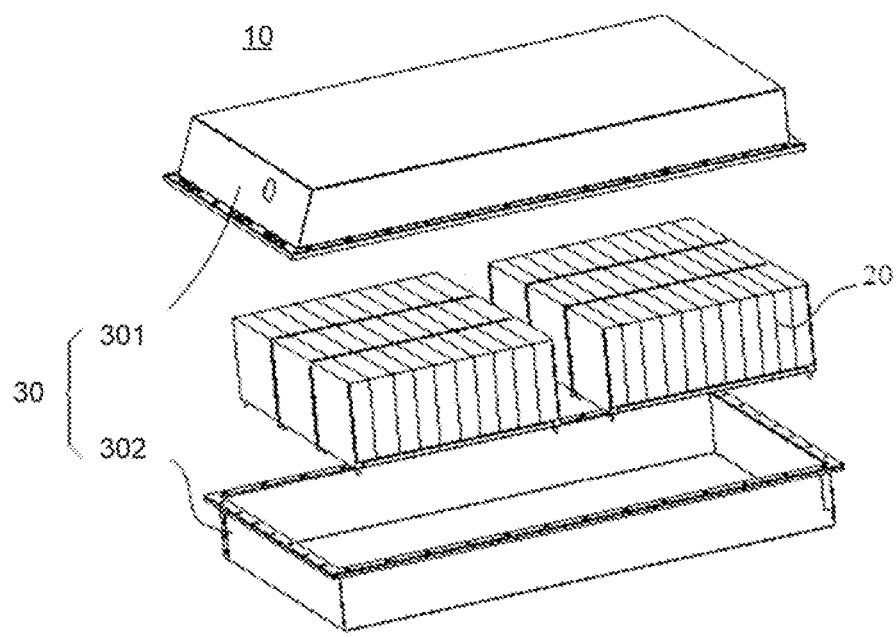
FIG. 2 is a schematic structural diagram of a battery according to an embodiment of this application.

FIG. 2 is a schematic structural diagram of a battery 10 according to an embodiment of this application. In FIG. 2, the battery 10 may include a plurality of battery modules 20 and a box 30. The plurality of battery modules 20 are accommodated in the box 30. The box 30 is configured to accommodate the battery cells 210 or the battery modules 20 to prevent liquids or other foreign matter from affecting charging or discharging of the battery cells 210. The box 30 may be a simple three-dimensional structure such as a rectangular cuboid, a cylinder, or a sphere, or may be of a complex three-dimensional structure formed by combining simple three-dimensional structures such as rectangular cuboids, cylinders or spheres. This is not limited in the embodiments of this application. The box 30 may be made of an alloy material such as an aluminum alloy and an iron alloy, a polymer material such as polycarbonate and polyisocyanurate foam, or a composite material produced from materials such as glass fiber and epoxy resin. This is also not limited in the embodiments of this application.

In some embodiments, the box 30 may include a first part 301 and a second part 302. The first part 301 and the second part 302 fit together with one covering another to jointly define a space for accommodating the battery cells 210. The second part 302 may be a hollow structure with an opening at one side, the first part 301 may be a plate structure, and the first part 301 covers the open side of the second part 302, so that the first part 301 and the second part 302 jointly define a space for accommodating the battery cells 210. The first part 301 and the second part 302 may both be a hollow structure with one side open, and the open side of the first part 301 covers the open side of the second part 302.

Figure 3:
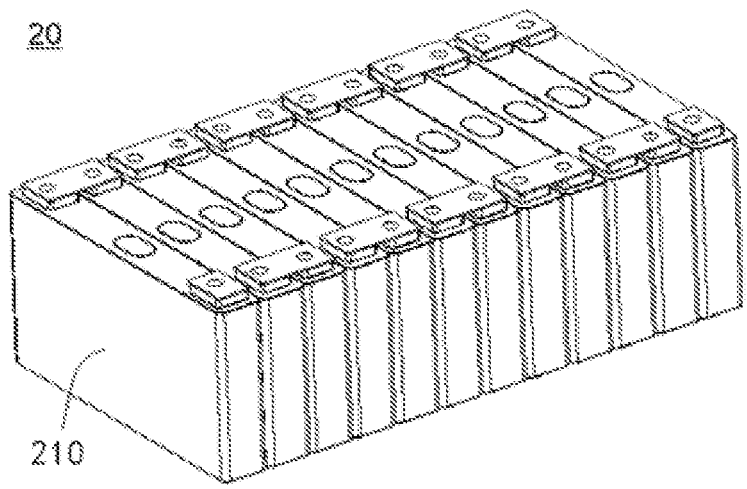
FIG. 3 is a schematic structural diagram of a battery module according to an embodiment of this application.

FIG. 3 is a schematic structural diagram of a battery module 20 according to an embodiment of this application. In FIG. 3, the battery module 20 may include a plurality of battery cells 210. The plurality of battery cells 210 may first be connected in series, parallel, or series and parallel to constitute battery modules, and then a plurality of battery modules 20 may be connected in series, parallel, or series and parallel to constitute a battery 10. In this application, the battery cells 210 may include lithium-ion cells, sodium-ion cells, magnesium-ion cells, or the like. This is not limited in the embodiments of this application. The battery cell 210 may be cylindrical, flat, or rectangular, or have another shape, and this is also not limited in the embodiments of this application. The battery cells 210 are usually categorized into three types depending on their packaging: cylindrical cells 210, prismatic cells 210, and pouch cells 210, and this is also not limited in the embodiments of this application. However, for brevity of description, the following embodiments are all described by taking prismatic cells 210 as an example.

Figure 4:
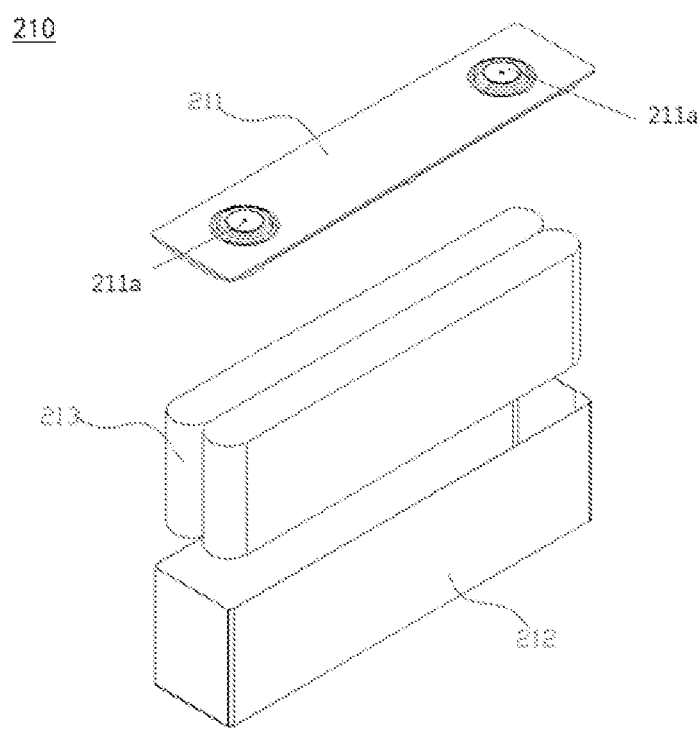
FIG. 4 is a schematic exploded view of a structure of a battery cell according to some embodiments of this application.

FIG. 4 is a schematic exploded view of a structure of the battery cell 210 according to some embodiments of this application. A battery cell 210 is a smallest element constituting a battery. As shown in FIG. 4, the battery cell 210 includes an end cover 211, a housing 212, and a cell assembly 213.

The end cover 211 is a component that covers an opening of the housing 212 to isolate an internal environment of the battery cell 210 from an external environment thereof. Without limitation, the end cover 211 may have a shape adapted to the shape of the housing 212 to fit the housing 212. Optionally, the end cover 211 may be made of a material with some hardness and strength (such as aluminum alloy), such that the end cover 211 is difficult to deform under pressing or collision, allowing the battery cell 210 to have a higher structural strength and improved safety performance. Functional components such as an electrode terminal 211a may be provided on the end cover 211. The electrode terminal 211a may be configured to be electrically connected to the cell assembly 213 for outputting or inputting electrical energy of the battery cell 210. In some embodiments, the end cover 211 may further be provided with a pressure relief mechanism for releasing internal pressure when the internal pressure or temperature of the battery cell 210 reaches a threshold. The end cover 211 may also be made of various materials, such as copper, iron, aluminum, stainless steel, aluminum alloy, and plastic, which is not particularly limited in the embodiments of this application. In some embodiments, an insulator may also be provided inside the end cover 211, and the insulator may be configured to isolate electrically connected components in the housing 212 from the end cover 211 to reduce risks of short circuit. For example, the insulator may be plastic, rubber, or the like.

The housing 212 is an assembly configured to cooperate with the end cover 211 to form an internal environment of the battery cell 210, where the formed internal environment can be used to accommodate the cell assembly 213, an electrolyte (not shown in the figure), and other components. The housing 212 and the end cover 211 may be separate components, an opening may be provided on the housing 212, and the end cover 211 covers the opening to form the internal environment for the battery cells 210. Without limitation, the end cover 211 and the housing 212 may alternatively be an integral whole. Specifically, the end cover 211 and the housing 212 may form a shared connection surface before other components are disposed inside the housing. And then the housing 212 is covered with the end cover 211 when inside of the housing 212 needs to be enclosed. The housing 212 may be of various shapes and sizes, such as rectangular cuboid, cylinder, and hexagonal prism. Specifically, the shape of the housing 212 may be determined according to a specific shape and size of the cell assembly 213. The housing 212 may be made of various materials, such as copper, iron, aluminum, stainless steel, aluminum alloy, and plastic, which is not particularly limited in the embodiments of this application.

The cell assembly 213 is a component in the battery cell 210 where electrochemical reactions take place. The housing 212 may include one or more cell assemblies 213. The cell assembly 213 is mainly formed by winding or laminating a positive-electrode plate and a negative-electrode plate, and a separator is generally provided between the positive-electrode plate and the negative-electrode plate. Parts with active material of the positive-electrode plate and the negative-electrode plate constitute a body portion of the cell assembly, and parts without active material of the positive-electrode plate and the negative-electrode plate constitute tabs (not shown in the figure). A positive tab and a negative tab may be located on one end of the body portion together or on two ends of the body portion respectively. During charging and discharging of the battery, the positive-electrode active material and the negative-electrode active material react with the electrolyte, and tabs are connected to electrode terminals to form a current loop.

As new energy electric vehicles get popular rapidly, charging time of electric vehicles has become one of the main elements that numerous electric vehicle owners care about in their daily driving. Using software algorithms to accurately predict a remaining charging time of a present charging process can provide accurate time basis for electric vehicle owners to properly arrange their time of vehicle use and time of work and life. A current method for calculating a remaining charging time under slow charging is as follows:

Remaining charging time under slow charging=remaining capacity to top up (CAP_remain)/output current of charging pile (I_act). A remaining charging time under slow charging of a present charging process of a battery may be roughly calculated by using the foregoing calculation formula. However, under some special working conditions, the remaining charging time under slow charging calculated by using this formula does not consider influence of other factors in the charge process and therefore will have a relatively large error from an actual charging time. Specifically, a main factor causing a large error of the foregoing calculation formula is that the remaining capacity to top up (CAP_remain) used in the calculation formula for calculating the remaining charging time under slow charging has introduced a large error. A method for calculating a remaining capacity to top up (CAP_remain) is:

Remaining capacity to top up (CAP_remain)=(charging target SOC (SOC_Tar)−present SOC)*cell capacity. In practical applications, there will be an error in calculating a SOC value in a charge process. Assuming that in a slow charging process, the SOC is falsely high by 3% when the battery is about to be fully charged, which means that an actual SOC is 97%. However, due to an error in the SOC calculation algorithm, the calculated SOC in this case is displayed as 100%, which is defined as the SOC being falsely high by 3%. Because a value of SOC is in a range of 0-100%, when the SOC is about to reach a SOC of full charge (100%), if the SOC is falsely high by 3%, the SOC will hold at 99.8% (or other values). When the state of charge is set to full charge based on a cell voltage of the battery, the SOC will be corrected to 100%; and when the SOC is displayed as 100%, a value 0 of the remaining charging time is transmitted. If charging is being performed with a charging current (a charging pile of 3.3 kW) at a charging rate of 0.05C, assuming that during slow charging, the SOC is falsely high by 3% where the real SOC is 97%, the SOC is displayed as holding at 99.8%. An actual time to full charge as calculated is still at least 36 minutes. However, because the SOC is already displayed as 99.8%, a calculated remaining charging time is 1 minute (assuming that a resolution of the remaining charging time is 1, and the calculated value is rounded up to an integer). In practical applications, this may cause a phenomenon that the calculated remaining charging time is 1 minute, but the actual time to full charge is still 36 minutes, which brings a bad vehicle use experience to an electric vehicle owner.

In order to resolve the foregoing problem, the embodiments of this application provide a method for calculating a charging time, which improves accuracy of a remaining charging time under slow charging. When a vehicle starts slow charging at high voltage, a charging gun is inserted to begin charging. A charging pile completes information exchange with the vehicle. The vehicle and a battery management system (BMS) complete internal communications. The battery management system (BMS) calculates a remaining charging time under slow charging, and the remaining charging time is displayed on a dashboard in the vehicle or on the charging pile or transmitted to a client terminal APP.

Figure 5:
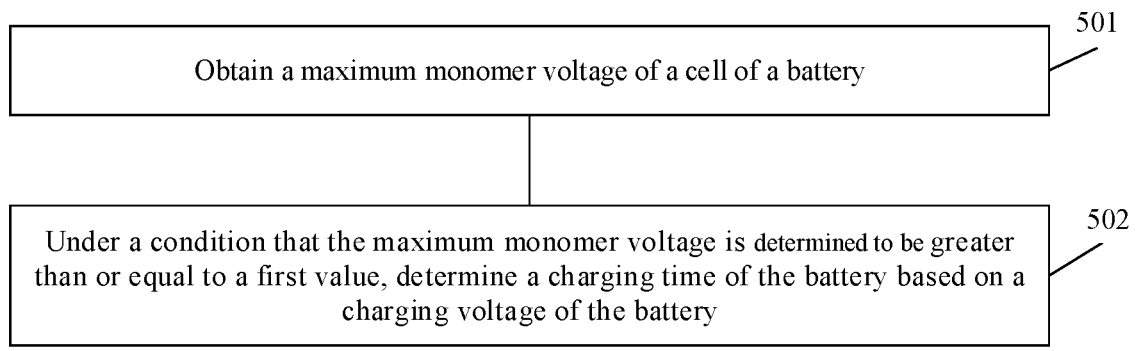
FIG. 5 is a schematic flowchart of a method for determining a charging time according to some embodiments of this application.

FIG. 5 is a schematic flowchart of a method for determining a charging time according to some embodiments of this application. As shown in FIG. 5, the method for determining a charging time in an embodiment of this application includes the following processing steps.

Step 501: Obtain a maximum monomer voltage of a cell of the battery.

For a condition that a state of charge SOC of the battery reaches a SOC corresponding to slow charging, the SOC corresponding to slow charging may be 97%, 95%, 98%, or the like. When the battery is under slow charging, when the true SOC reaches 97%, because the SOC is falsely high, the determined SOC is inaccurate. In this case, if the charging time is calculated based on the false SOC being displayed, the calculated charging time will have a large error from the true charging time. Therefore, a logic of determining the remaining charging time of the battery needs to be adjusted at that point. In some embodiments of this application, a remaining capacity to top up at that point is determined by obtaining a maximum monomer voltage of a cell of the battery, and a remaining charging time of the battery is determined based on the newly determined remaining capacity to top up.

Step 502: Under a condition that the maximum monomer voltage is determined to be greater than or equal to a first value, determine a charging time of the battery based on a charging voltage of the battery.

Under the condition that the maximum monomer voltage of the cell of the battery is obtained and the maximum monomer voltage is determined to be greater than or equal to a first value, the charging time of the battery is determined by using the method of battery charging according to the embodiments of this application.

The embodiments of this application mainly aim at determining a charging time when a battery SOC corresponding to slow charging is reached. For the condition that the maximum monomer voltage of the cell of the battery is greater than or equal to a first value, the first value may be set according to specific application scenarios. Through the change of charging time determination as in the embodiments of this application, when the SOC corresponding to slow charging is reached, the charging time determined according to the embodiments of this application is more accurate with less error.

According to some embodiments of this application, the determining, based on a charging voltage of the battery, a charging time of the battery specifically includes:

calculating, based on a remaining capacity to top up and a charging current of the battery, a first remaining charging duration and saving the first remaining charging duration; calculating, based on the charging voltage of the battery and the first remaining charging duration, a second remaining charging duration of the battery in real time; and determining, based on a present time and the second remaining charging duration, the charging time of the battery.

The embodiments of this application propose a method for calculating a charging time when a battery SOC corresponding to slow charging is reached. To be specific, a remaining charging time is determined based on a charging voltage of the battery, and a charging time of the battery is determined based on a present time. The charging time determined in this way is more accurate, allowing an owner of an electric vehicle to arrange his/her own time properly based on the charging time of the battery and to determine a time when the battery is fully charged, allowing a user to conveniently use the vehicle.

According to some embodiments of this application, the method further includes:

calculating a first difference between a charging voltage of the cell fully charged under slow charging and the maximum monomer voltage; and determining a ratio of the first difference to the first value as a voltage-follow ratio of a remaining charging time of the battery.

In the embodiments of this application, by determining the first difference between the charging voltage of the cell fully charged under slow charging and the maximum monomer voltage, the voltage-follow ratio of the remaining charging time of the battery can be determined, which facilitates accurate determination of the charging time when the battery SOC corresponding to slow charging is reached.

According to some embodiments of this application, the calculating, based on a charging voltage and the first remaining charging duration of the battery, a second remaining charging duration of the battery in real time includes:

calculating a product of the first remaining charging duration multiplying the voltage-follow ratio and determining the product as the second remaining charging duration.

In the embodiments of this application, when the maximum monomer voltage of a cell of the battery continues to rise, a logic for calculating the charging time of the battery needs to be adjusted. Specifically, when the logic for calculating the remaining charging time changes to a voltage-follow calculation logic, the remaining charging time of the battery needs to be determined again based on the voltage-follow ratio, so as to determine a remaining charging time to fully charge the battery to provide a more accurate battery charging time.

According to some embodiments of this application, the calculating, based on a remaining capacity to top up and a charging current of the battery, a first remaining charging duration includes:

calculating, based on a present SOC of the battery and a total capacity of the battery, a remaining capacity to top up of the battery; and calculating, based on the remaining capacity to top up and a present charging current of the battery, the first remaining charging duration.

In the embodiments of this application, to determine the charging time of the battery, it is also necessary to calculate, based on the remaining capacity to top up and the charging current of the battery, another remaining charging time, which is considered in combination with the foregoing charging time determined based on the maximum monomer voltage of the cell of the battery to determine the charging time of the battery. A charging time of the battery thus determined is more accurate, helping a user know an accurate charging time, and allowing the user to conveniently use the vehicle and plan his/her own actions.

According to some embodiments of this application, the first value is a second difference between a charging voltage of the cell fully charged under slow charging and a given voltage threshold, where the given voltage threshold is set under a condition that the charging time of the battery is determined based on a charging voltage of the battery.

In the embodiments of this application, the first value in the determining whether a maximum monomer voltage of a cell of a battery is greater than or equal to a first value can be determined as a difference between the charging voltage of the cell fully charged under slow charging and the given voltage threshold. The given voltage threshold may be determined via simulation based on charging features of the battery. Setting a voltage threshold helps determine a more accurate remaining charging time of the battery.

According to some embodiments of this application, the method further includes:

in response to arrival of a transmission cycle or a request message, outputting the determined charging time of the battery to a target object.

According to some embodiments of this application, the method further includes:

displaying a charging time of the battery via a display unit or transmitting the charging time of the battery to a managed client application via a network connection.

In the embodiments of this application, the determined remaining charging time of the battery needs to be outputted to a user for the user to make arrangements based on the remaining charging time of the battery. Specifically, the remaining time may be outputted via a display unit or transmitted via remote communication to a portable electronic device of the user, for example, a mobile phone. In this way, the user can obtain the charging time of the battery without direct viewing, which is more convenient for the user to know the battery charging time.

The following further explains the essence of the technical solutions according to the embodiments of this application by using specific examples.

Considering a condition that at a stage when an electric vehicle is about to be fully charged, inaccurately calculating a remaining charging time leads to poor experience of an electric vehicle owner, a logic for calculating a remaining charging time by a battery management system (BMS) according to an embodiment of this application includes the following steps:

Step 1: Because under slow charging, an output power is constant and a current is relatively stable, at the late stage of slow charging, the maximum monomer voltage increases monotonically and progressively. When the maximum monomer voltage of the cell of the battery is greater than or equal to a charging voltage of the cell fully charged under slow charging (Volt_FullChrgVolt) minus a voltage-follow voltage threshold (Volt_acfollowvoltThr), the logic for calculating a remaining charging time changes from originally calculating the remaining charging time based on a remaining capacity to top up (CAP_remain) divided by an output current of a charging pile (I_act) to currently calculating the remaining charging time based on a charging voltage of the battery. When the logic for calculating the remaining charging time steps into the voltage-follow stage, the remaining charging time to save (RemainTime_Save) is calculated based on a SOC gap. Specifically, under a condition that the maximum monomer voltage of a cell of the battery is greater than or equal to the charging voltage of the cell fully charged under slow charging (Volt_FullChrgVolt) minus the voltage-follow voltage threshold (Volt_acfollowvoltThr), the remaining charging time (RemainTime_Save) is calculated based on the SOC gap. The voltage-follow voltage threshold can be determined based on test data or determined by simulation based on battery properties.

Step 2: Under slow charging, the maximum monomer voltage of the cell of the battery continues to rise. When the logic for calculating the remaining charging time changes to the voltage-follow calculation logic, a voltage-follow ratio of the remaining charging time needs to be calculated. A formula for calculating the voltage-follow ratio is: (charging voltage of the cell fully charged under slow charging (Volt_FullChrgVolt)−maximum monomer voltage of the cell of the battery (Volt_MaxVolt))/(charging voltage of the cell fully charged under slow charging (Volt_FullChrgVolt)−voltage-follow voltage threshold (Volt_acfollowvoltThr).

Step 3: Under slow charging, when the logic for calculating the remaining charging time steps into the voltage-follow stage, as the charging voltage continues to rise, a formula for calculating the remaining charging time is changed to: remaining charging time under slow charging=remaining charging time (RemainTime_Save)*voltage-follow ratio (Ratio_StepIntoFollowVolt). As the charging voltage continues to rise during charging, the voltage-follow ratio (Ratio_StepIntoFollowVolt) gradually decreases. When full charge is reached, the voltage-follow ratio gradually decreases to 0, and the remaining charging time calculated is also reduced to 0.

According to some embodiments of this application, the embodiments of this application further record a battery management system, including a processor and a storage medium, where the storage medium stores a computer program. When executed by the processor, the computer program is able to calculate a charging time by using the method for determining a charging time.

According to some embodiments of this application, the embodiments of this application further record a battery, including a battery cell and the foregoing battery management system.

According to some embodiments of this application, this application further records an electrical energy device, including a device body and a power supply, where the power supply is the foregoing battery.

The electrical energy device in the embodiments of this application may be any one of the foregoing devices or systems using a battery.

In conclusion, it should be noted that the above embodiments are merely intended for describing the technical solutions of this application but not for limiting this application. Although this application is described in detail with reference to the foregoing embodiments, persons of ordinary skill in the art should understand that they may still make modifications to the technical solutions described in the foregoing embodiments or make equivalent replacements to some or all technical features thereof without departing from the scope of the technical solutions of the embodiments of this application. These modifications and equivalent replacements shall all be covered in the scope of claims and specification of this application. In particular, as long as there is no structural conflict, the various technical features mentioned in the embodiments can be combined in any manner. This application is not limited to the specific embodiments disclosed in this specification, but includes all technical solutions falling within the scope of the claims.

The invention claimed is:

1. A method for determining a charging time, comprising:
   obtaining a maximum monomer voltage of a cell of a battery of an electric vehicle;
   in response to determining that the maximum monomer voltage is greater than or equal to a value, determining, based on a charging voltage of the battery, the charging time of the battery, comprising:
      calculating, based on a remaining capacity to top up and a charging current of the battery, a first remaining charging duration and saving the first remaining charging duration;
      calculating, based on the charging voltage of the battery and the first remaining charging duration, a second remaining charging duration of the battery in real time, comprising:
         calculating a difference between a charging voltage of the cell fully charged under slow charging and the maximum monomer voltage;
         determining a ratio of the difference to the value as a voltage-follow ratio of the remaining charging time of the battery; and
         calculating a product of the first remaining charging duration multiplying the voltage-follow ratio and determining the product as the second remaining charging duration; and
      determining, based on a present time and the second remaining charging duration, the charging time of the battery; and
   in response to arrival of a transmission cycle or a request message, transmitting an indication of the second remaining charging duration to a display unit of the electric vehicle for display.

2. The method according to claim 1, wherein calculating, based on the remaining capacity to top up and the charging current of the battery, the first remaining charging duration comprises:
   calculating, based on a present state of charge (SOC) of the battery and a total capacity of the battery, the remaining capacity to top up of the battery; and
   calculating, based on the remaining capacity to top up and a present charging current of the battery, the first remaining charging duration.

3. The method according to claim 1, wherein:
   the value is a difference between a voltage of the cell fully charged under slow charging and a given voltage threshold; and
   the given voltage threshold is set under a condition that the charging time of the battery is determined based on the charging voltage of the battery.

4. The method according to claim 1, wherein the indication of the second remaining charging duration is further transmitted to an electronic device remote from the electric vehicle via a network connection.

5. The method according to claim 1, wherein in response to the arrival of the transmission cycle or the request message, an indication of the charging time of the battery is transmitted to the display unit of the electric vehicle for display and/or to an electronic device remote from the electric vehicle via a network connection.

6. A battery management system, comprising:
   a processor; and
   a storage medium storing a computer program that, when executed by the processor, causes the processor to:
      obtain a maximum monomer voltage of a cell of a battery of an electric vehicle;
      in response to determining that the maximum monomer voltage is greater than or equal to a value, determine, based on a charging voltage of the battery, the charging time of the battery, comprising:
         calculating, based on a remaining capacity to top up and a charging current of the battery, a first remaining charging duration and saving the first remaining charging duration;
         calculating, based on the charging voltage of the battery and the first remaining charging duration, a second remaining charging duration of the battery in real time, comprising:
            calculating a difference between a charging voltage of the cell fully charged under slow charging and the maximum monomer voltage;
            determining a ratio of the difference to the value as a voltage-follow ratio of the remaining charging time of the battery; and
            calculating a product of the first remaining charging duration multiplying the voltage-follow ratio and determining the product as the second remaining charging duration; and
         determining, based on a present time and the second remaining charging duration, the charging time of the battery; and
      in response to arrival of a transmission cycle or a request message, transmit an indication of the second remaining charging duration to a display unit of the electric vehicle for display.

7. The system according to claim 6, wherein the computer program further causes the processor to:
   calculate, based on a present state of charge (SOC) of the battery and a total capacity of the battery, the remaining capacity to top up of the battery; and calculate, based on the remaining capacity to top up and a present charging current of the battery, the first remaining charging duration.

8. The system according to claim 6, wherein:
the value is a difference between a voltage of the cell fully charged under slow charging and a given voltage threshold; and
the given voltage threshold is set under a condition that the charging time of the battery is determined based on the charging voltage of the battery.

9. A battery of an electric vehicle, comprising:
a battery cell; and
a battery management system comprising a processor and a storage medium storing a computer program that, when executed by the processor, causes the processor to:
   obtain a maximum monomer voltage of a cell of the battery;
   in response to determining that the maximum monomer voltage is greater than or equal to a value, determine, based on a charging voltage of the battery, the charging time of the battery, comprising:
      calculating, based on a remaining capacity to top up and a charging current of the battery, a first remaining charging duration and saving the first remaining charging duration;
      calculating, based on the charging voltage of the battery and the first remaining charging duration, a second remaining charging duration of the battery in real time, comprising:
         calculating a difference between a charging voltage of the cell fully charged under slow charging and the maximum monomer voltage;
         determining a ratio of the difference to the value as a voltage-follow ratio of the remaining charging time of the battery; and
         calculating a product of the first remaining charging duration multiplying the voltage-follow ratio and determining the product as the second remaining charging duration; and
      determining, based on a present time and the second remaining charging duration, the charging time of the battery; and
   in response to arrival of a transmission cycle or a request message, transmit an indication of the second remaining charging duration to a display unit of the electric vehicle for display.

* * * * *